(12) United States Patent
Nakamura

(10) Patent No.: US 12,519,019 B2
(45) Date of Patent: Jan. 6, 2026

(54) WAFER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 493 days.

(21) Appl. No.: 18/178,923

(22) Filed: Mar. 6, 2023

(65) Prior Publication Data

US 2023/0298940 A1    Sep. 21, 2023

(30) Foreign Application Priority Data

Mar. 17, 2022   (JP) ................................. 2022-042151

(51) Int. Cl.
| | |
|---|---|
| *H01L 21/78* | (2006.01) |
| *B23K 26/00* | (2014.01) |
| *B23K 26/53* | (2014.01) |
| *B23K 101/40* | (2006.01) |
| *H01L 21/02* | (2006.01) |
| *H01L 21/683* | (2006.01) |

(52) U.S. Cl.
CPC .......... *H01L 21/78* (2013.01); *B23K 26/0093* (2013.01); *B23K 26/53* (2015.10); *H01L 21/02076* (2013.01); *H01L 21/6836* (2013.01); *B23K 2101/40* (2018.08); *H01L 2221/68327* (2013.01); *H01L 2221/6834* (2013.01)

(58) Field of Classification Search
None
See application file for complete search history.

(56) References Cited

U.S. PATENT DOCUMENTS

| | | | |
|---|---|---|---|
| 2015/0357224 A1* | 12/2015 | Nakamura | H10D 84/01 438/462 |
| 2015/0357242 A1* | 12/2015 | Nakamura | H01L 21/304 438/462 |
| 2015/0364375 A1 | 12/2015 | Nakamura et al. | |
| 2016/0172312 A1* | 6/2016 | Nakamura | H01L 21/304 438/462 |
| 2019/0348325 A1 | 11/2019 | Obata | |

FOREIGN PATENT DOCUMENTS

| | | |
|---|---|---|
| JP | 1140520 A | 2/1999 |
| JP | 2014078569 A | 5/2014 |

OTHER PUBLICATIONS

Office Action issued in counterpart German patent application No. 10 2023 202 173.0, dated Oct. 11, 2024.

\* cited by examiner

*Primary Examiner* — Erik T. K. Peterson
(74) *Attorney, Agent, or Firm* — Greer Burns & Crain Ltd.

(57) ABSTRACT

A wafer processing method includes forming a start point of division along division lines, providing, on a front surface of the wafer, a protective member for protecting the front surface of the wafer, grinding a back surface of the wafer to a desired thickness, forming division grooves in the division lines to divide the wafer into individual device chips, providing an expandable sheet to the back surface of the wafer and removing the protective member from the front surface of the wafer, coating the front surface of the wafer with an adhesive liquid having flowability, expanding and shrinking the sheet so as to allow the adhesive liquid to enter each of the division grooves and to discharge the adhesive liquid from the division grooves, and removing the adhesive liquid from the front surface of the wafer to clean a side surface of each of the division grooves.

5 Claims, 8 Drawing Sheets

WAFER PROCESSING METHOD

BACKGROUND OF THE INVENTION

Field of the Invention

The present invention relates to a wafer processing method of dividing a wafer into individual device chips, the wafer being formed with a plurality of devices on a front surface thereof, and the front surface being demarcated by a grid of a plurality of crossing division lines.

Description of the Related Art

In processing a wafer having a plurality of devices such as integrated circuits (ICs) and large-scale integrations (LSIs) on a front surface thereof, the plurality of devices being separated from each other by a plurality of crossing division lines formed on the front surface of the wafer, a back surface of the wafer is ground by use of a grinding apparatus to thereby reduce a thickness of the wafer to a desired thickness. Thereafter, the wafer is divided along the division lines into individual device chips by use of a dicing apparatus or a laser processing apparatus. These device chips thus divided are used in electrical equipment such as mobile phones and personal computers.

In addition, the present applicant has proposed such a technique that a focusing point of a laser beam of a wavelength transmitting through a wafer is positioned inside the wafer corresponding to each division line, and the laser beam is applied thereto to thereby form a modified layer as a start point of division, and a back surface of the wafer is then ground to reduce the thickness of the wafer to a desired thickness, dividing the wafer into individual device chips (for example, see Japanese Patent Laid-Open No. 2014-078569).

In the technique disclosed in Japanese Patent Laid-Open No. 2014-078569, there is provided such an advantage that a modified layer can properly be formed inside a yet-to-be ground wafer (that is, a wafer being relatively thick) corresponding to a division line by positioning a focusing point of a laser beam inside the wafer. Note that, when the thickness of the wafer is too small, positioning the focusing point of the laser beam inside the wafer corresponding to the division line becomes difficult, causing a region in which the modified layer is not formed inside the wafer corresponding to the division line.

In addition, In the technique disclosed in Japanese Patent Laid-Open No. 2014-078569, the wafer can be formed to a desired thickness, and moreover, a crack reaching from the modified layer to the front surface of the wafer extends during grinding, so that this cleavage attributable to the crack results in dividing the wafer into individual device chips. Hence, even if the wafer is finished to be thin, there is also an advantage that die strength of each of the device chips can be enhanced.

SUMMARY OF THE INVENTION

However, processing debris generated at a time of grinding may enter a division groove formed in a division line and be attached to a side surface of a device chip. In such a case, at times of wire bonding, die bonding, stacking of device chips, and the like which are to be carried out in a back-end process, processing debris falling and scattered from the side surface of the device chip may prevent the bonding and may be attached to the front surface of the device chip, thereby causing damage to the stacked device chips.

Such problems may occur also in a technique referred to as dicing before grinding (for example, see Japanese Patent Laid-Open No. Hei 11-40520). In dicing before grinding technique, a groove having a depth corresponding to a finished thickness of each device chip is formed in each division line as a start point of division, and a back surface of a wafer is ground to a finished thickness of each device chip, to thereby divide the wafer into individual device chips.

It is accordingly an object of the present invention to provide a wafer processing method by which a problem caused by processing debris attached to a side surface of a device chip can be eliminated.

In accordance with an aspect of the present invention, there is provided a wafer processing method of dividing a wafer into individual device chips, the wafer having a plurality of devices formed on a front surface thereof, and the front surface being demarcated by a plurality of crossing division lines. The wafer processing method includes a division start point forming step of forming a start point of division along each of the division lines, a protective member providing step of providing, on the front surface of the wafer, a protective member for protecting the front surface of the wafer, before or after the division start point forming step is carried out, a back surface grinding step of holding the protective member side of the wafer on a chuck table, grinding a back surface of the wafer to finish the wafer to a desired thickness, and forming division grooves along the division lines to divide the wafer into individual device chips, a sheet providing step of providing an expandable sheet to the back surface of the wafer and removing the protective member from the front surface of the wafer, an adhesive liquid coating step of coating the front surface of the wafer with an adhesive liquid having flowability, a sheet expanding and shrinking step of expanding and shrinking the sheet provided in the sheet providing step such that a width of each of the division grooves is expanded to allow the adhesive liquid to enter each of the division grooves and the width of each of the division grooves is decreased to discharge the adhesive liquid from each of the division grooves, and a cleaning step of removing the adhesive liquid from the front surface of the wafer to clean at least a side surface of each of the division grooves.

Preferably, in the division start point forming step, a focusing point of a laser beam of a wavelength transmitting through the wafer is positioned inside the wafer corresponding to each of the division lines, and laser beam is applied to the wafer, thereby forming a modified layer serving as a start point of division.

Preferably, in the division start point forming step, grooves each having a depth corresponding to a finished thickness of each of the device chips are formed along the division lines so as to function as a start point of division.

Preferably, the protective member providing step is carried out after the division start point forming step is carried out. Preferably, the adhesive liquid used in the adhesive liquid coating step includes any of polyvinyl alcohol, polyethylene oxide, polyacrylamide, carboxymethyl cellulose, resol-type phenolic resin, methylolated urea-formaldehyde resin, and methylolated melamine resin, and in the cleaning step, cleaning water is supplied to remove the adhesive liquid.

According to the wafer processing method of the present invention, the adhesive liquid having flowability catches the processing debris attached to the side surface of each of the device chips, and the side surface of each of the division grooves is cleaned, so that the processing debris in addition to the adhesive liquid can be removed from the side surface of each of the device chips. Hence, problems attributable to the processing debris attached to the side surface of each of the device chips can be eliminated.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
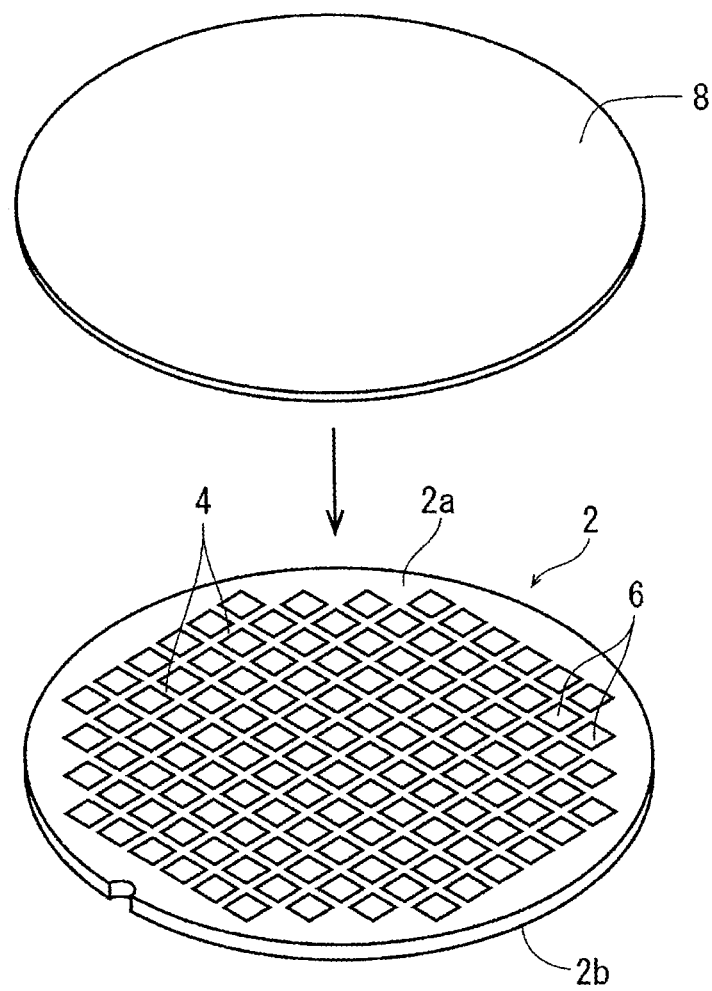
FIG. 1 is a perspective view depicting a manner in which a protective member providing step in a wafer processing method according to a preferred embodiment of the present invention is carried out.

Hereinafter, a detailed description will be given regarding a wafer processing method according to a preferred embodiment of the present invention with reference to the drawings. FIG. 1 depicts a disc-shaped wafer 2 which is to be processed through the wafer processing method according to the embodiment of the present invention. The wafer 2 may be formed of, for example, an appropriate semiconductor material such as silicon. A front surface 2a of the wafer 2 is demarcated by a grid of division lines 4 into a plurality of rectangular regions, and each of the plurality of rectangular regions has a device 6 such as an IC or an LSI formed therein.

(Protective Member Providing Step)

In the present embodiment, as depicted in FIG. 1, first, a protective member providing step of providing a protective member 8 onto a front surface 2a of the wafer 2 for protection is carried out. As the protective member 8, a circular-shaped adhesive tape having substantially the same diameter as that of the wafer 2 can be used. Then, the protective member 8 is adhered to the front surface 2a of the wafer 2.

(Division Start Point Forming Step)

In the present embodiment, after the protective member providing step is carried out, a division start point forming step is carried out to form a start point of division in each division line 4.

Figure 2A:
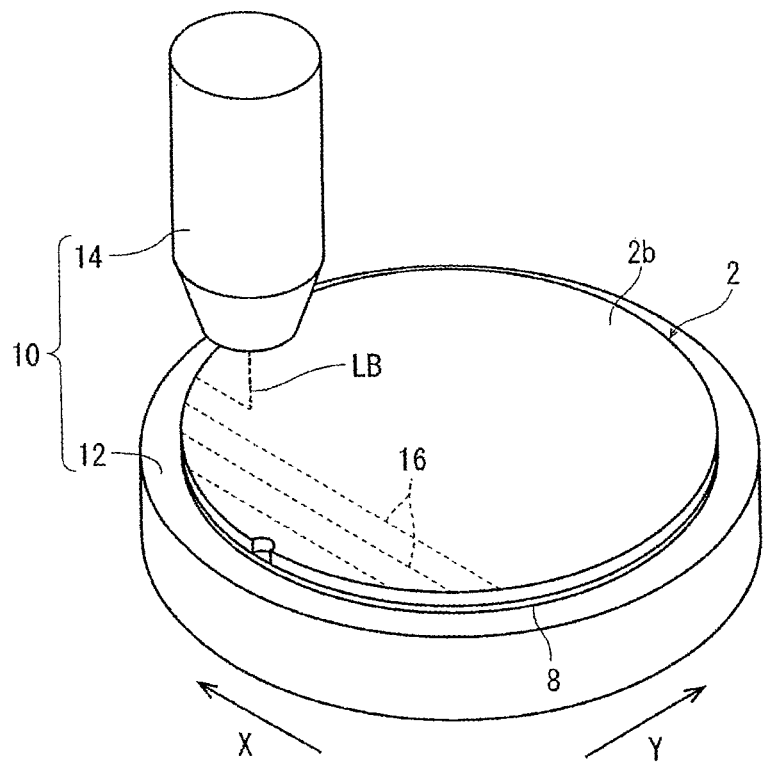
FIG. 2A is a perspective view depicting a manner in which a modified layer is formed in a wafer in a division start point forming step in the wafer processing method.

The division start point forming step can be carried out by use of a laser processing apparatus 10 depicted in FIG. 2A, for example. The laser processing apparatus 10 includes a chuck table 12 for holding under suction the wafer 2, a laser oscillator (not illustrated) which applies a pulsed laser beam LB of a wavelength transmitting through the wafer 2, focusing means 14 which focuses the pulsed laser beam LB emitted from the laser oscillator to apply the focused beam to the wafer 2 held under suction on the chuck table 12, and an imaging unit (not illustrated) which images the wafer 2 held under suction on the chuck table 12.

The chuck table 12 is configured in a rotatable manner with an axis extending in a vertical direction as a center and is movable in an X-axis direction indicated with an arrow X in FIG. 2A and in a Y-axis direction (a direction indicated with an arrow Y in FIG. 2A) perpendicular to the X-axis direction. Note that an XY plan defined by the X-axis direction and the Y-axis direction is substantially horizontal.

The imaging unit includes a typical image sensor (Charge Coupled Device (CCD)) which images the wafer 2 with use of a visible light beam, infrared ray applying means which applies an infrared ray passing through the wafer 2 to the wafer 2, an optical system which catches the infrared ray applied from the infrared ray applying means, and an image sensor (infrared CCD) which outputs an electric signal corresponding to the infrared ray caught by the optical system.

A description is continued with reference to FIG. 2A. In the division start point forming step, first, with a back surface 2b of the wafer 2 facing upward, the wafer 2 is held under suction on an upper surface of the chuck table 12. Then, the imaging unit applies the infrared ray toward the back surface 2b of the wafer 2, and an image of the front surface 2a side of the wafer 2 is captured by use of the infrared ray passing through the back surface 2b of the wafer 2. On the basis of the image of the wafer 2 captured by the imaging unit, a predetermined division line 4 extending in a first direction is aligned with the X-axis direction. In addition, the laser beam LB is made to aim at the division line 4 that has been aligned with the X-axis direction, and the focusing point of the laser beam LB is positioned inside the wafer 2 corresponding to the division line 4.

Figure 2B:
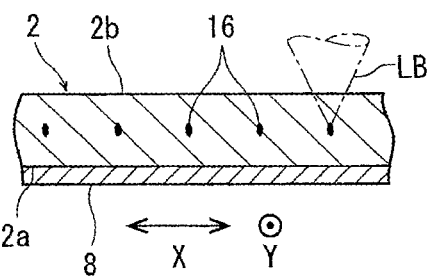
FIG. 2B is a cross-sectional view of the wafer in which the modified layer is formed along each division line, in a partly enlarged manner.

Then, while the chuck table 12 is processing fed in the X-axis direction, the laser beam LB of a wavelength transmitting through the wafer 2 is applied from the focusing means 14 toward the wafer 2, and as depicted in FIG. 2A and FIG. 2B, a modified layer 16 is formed along the division line 4 inside the wafer 2, as a start point of division. Note that, in perspective of preventing the die strength of the device chip from being lowered, in a back surface grinding step to be described later, it is preferable to form the modified layer 16 at a depth at which the modified layer 16 can be removed at a time of grinding the back surface 2b of the wafer 2.

Next, the chuck table 12 is indexing fed in the Y-axis direction with respect to the focusing means 14 by an interval of adjacent ones of the division lines 4 in the Y-axis direction. Then, application of the laser beam LB and the indexing feeding are repeated alternately, forming the modified layers 16 inside the wafer 2 along all the division lines 4 extending in the first direction that has been aligned with the X-axis direction.

Figure 2C:
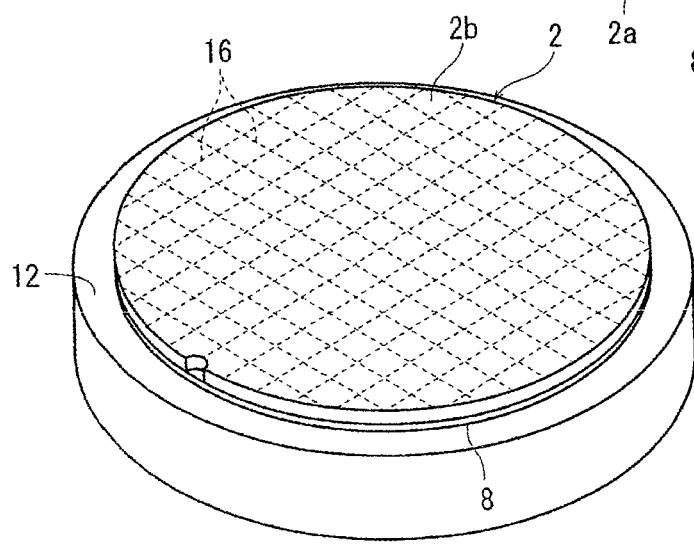
FIG. 2C is a perspective view of the wafer in which the modified layer is formed along each division line.

In addition, the chuck table 12 is rotated at 90 degrees, a predetermined division line 4 extending in a second direction perpendicular to the first direction is made to be aligned with the X-axis direction, and application of the laser beam LB and indexing feeding are repeated alternately, thereby forming modified layers 16 inside the wafer 2 along all the division lines 4 extending in the second direction perpendicular to the division lines 4 along which the modified layers 16 have been formed early. In this manner, the division start point forming step is carried out, and as depicted in FIG. 2C, the modified layers 16 are formed inside the wafer 2 in a grid shape along the grid of the division lines 4.

Such a division start point forming step can be carried out, for example, in the following processing condition.

Wavelength of a pulsed laser beam: 1342 nm
Average power: 1.0 W
Repetition frequency: 90 kHz
Feed speed: 700 mm/s Note that, in the foregoing description, the modified layers 16 are formed by application of the laser beam LB from the back surface 2b side of the wafer 2; however, the modified layer 16 may be formed by application of the laser beam LB from the front surface 2a side of the wafer 2. In this case, after the division start point forming step is carried out, the protective member providing step is carried out.

In the present embodiment, an example in which the modified layers 16 are formed as a start point of division has been described. Alternatively, a groove having a depth corresponding to a finished thickness of each device chip is formed along each division line 4 on the front surface 2a side of the wafer 2 so as to serve as a start point of division in place of the modified layers 16. Such a groove can be formed by ablation processing due to application of a laser beam or by cutting processing with use of a dicing apparatus.

(Ablation Processing)

Figure 3:
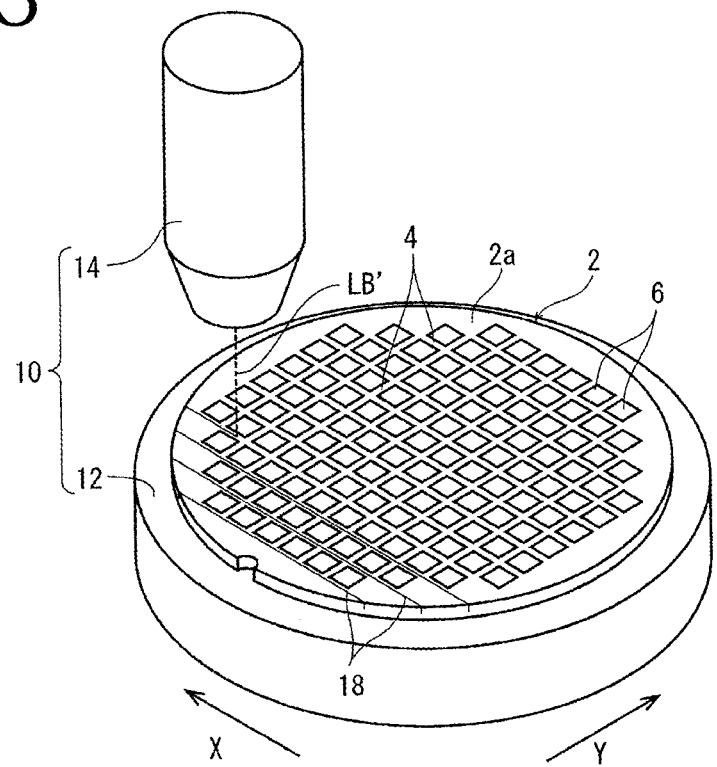
FIG. 3 is a perspective view depicting a manner in which a plurality of grooves each having a depth corresponding to a finished thickness of each device chip are formed by ablation processing in the division start point forming step.

A description is given with reference to FIG. 3. In the case of ablation processing, before the protective member 8 is provided on the front surface 2a of the wafer 2, with the front surface 2a facing upward, the wafer 2 is held under suction on the chuck table 12. Then, a predetermined division line 4 extending in the first direction is aligned with the X-axis direction, and a laser beam LB' of a wavelength having an absorbability to the wafer 2 is made to aim at the division line 4. In addition, the focusing point of the laser beam LB' is positioned to the front surface 2a of the wafer 2.

Then, while the chuck table 12 is processing fed in the X-axis direction, the laser beam LB' is applied to the wafer 2, so that a laser-processed groove 18 can be formed along the division line 4 on the front surface 2a of the wafer 2 with the depth corresponding to the finished thickness of the device chip. Note that, as in the case of forming the modified layers 16, application of the laser beam LB' and indexing feeding are alternately repeated, and the laser-processed grooves 18 in a grid shape are formed along the grid of the division lines 4 on the front surface 2a of the wafer 2.

In a case in which the laser-processed groove 18 is used as a start point of division, for example, the division start point forming step can be carried out under the following processing condition.

Wavelength of a pulsed laser beam: 355 nm
Average power: 2.0 W
Repetition frequency: 80 kHz
Feed speed: 300 mm/s (Cutting Processing)

Figure 4:
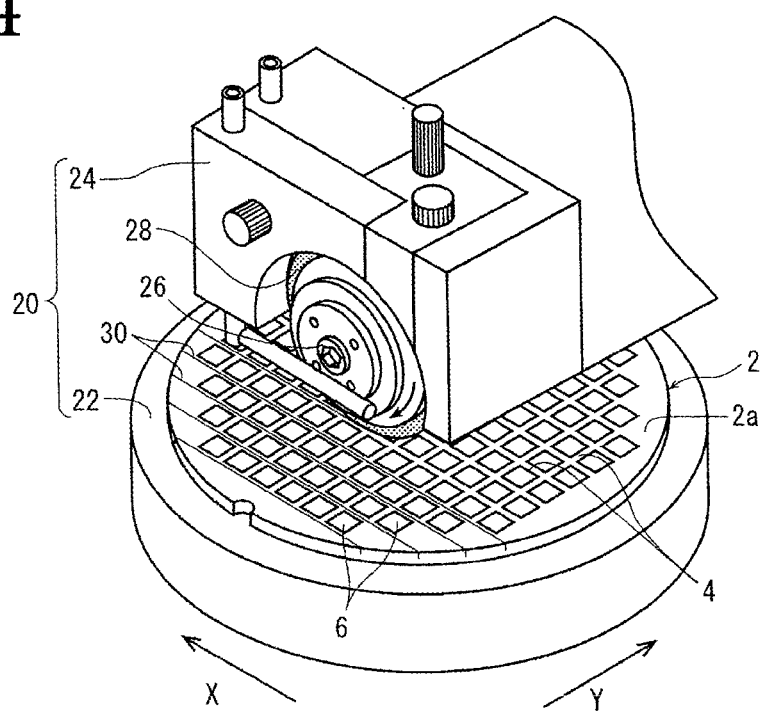
FIG. 4 is a perspective view depicting a manner in which a plurality of grooves each having a depth corresponding to a finished thickness of each device chip are formed by cutting processing in the division start point forming step.

In a case in which the groove is formed by cutting processing, for example, a dicing apparatus 20 depicted in FIG. 4 can be used. The dicing apparatus 20 includes a chuck table 22 for holding the wafer 2 under suction, and a cutting unit 24 which cuts the wafer 2 held under suction on the chuck table 22. The cutting unit 24 includes a spindle 26 which is rotatable around an axis extending in the Y-axis direction, and an annular cutting blade 28 which is fixed to a distal end of the spindle 26.

Also in the case of the cutting processing, before the protective member 8 is provided onto the front surface 2a of the wafer 2, the wafer 2 is held under suction on an upper surface of the chuck table 22 with the front surface 2a of the wafer 2 facing upward. Then, a cutting edge of the cutting blade 28 being rotated at high speed is made to cut in the division line 4 which is aligned with the X-axis direction to a depth corresponding to the finished thickness of the device chip from the front surface 2a of the wafer 2, and the chuck table 22 is processing fed in the X-axis direction, while cutting water is supplied to a portion in which the cutting edge of the cutting blade 28 is made to cut.

As a result, it is possible to form a cut groove 30 having a depth corresponding to the finished thickness of the device chip along the division line 4. Also in the case of carrying out the cutting processing, formation of the cut groove 30 and indexing feeding are alternately repeated, and the cut grooves 30 in a grid shape are formed on the front surface 2a of the wafer 2 along the grid of the division lines 4.

In a case in which the cut groove 30 is used as a start point of division, for example, the division start point forming step can be carried out under the following processing condition.

Figure 5A:
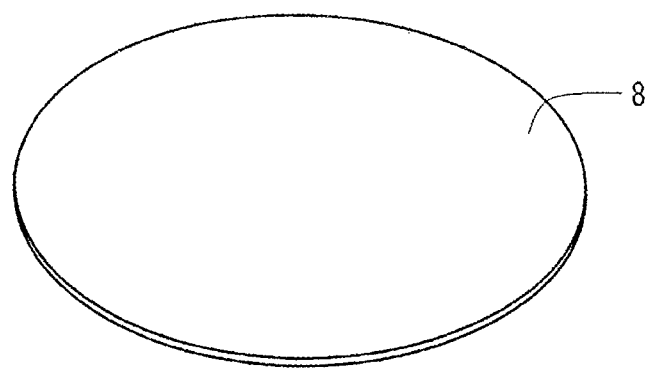
FIG. 5A is a perspective view depicting a state in which a protective member is provided on a front surface of the wafer in which the plurality of grooves each having the depth corresponding to the finished thickness of each device chip are formed.
Figure 5A:
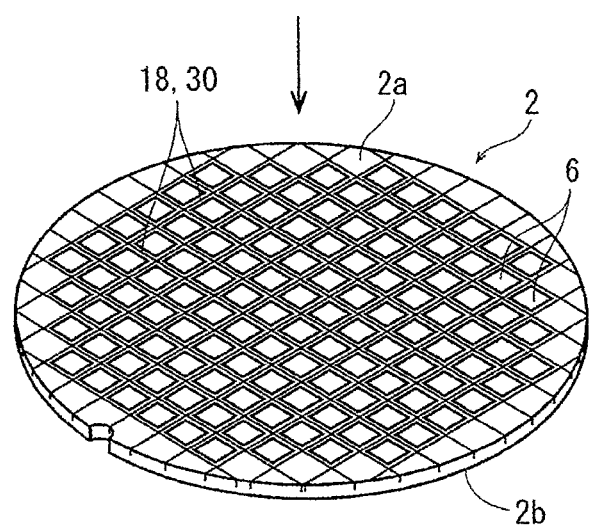
Figure 5B:
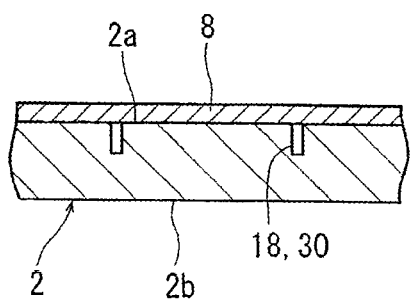
FIG. 5B is a cross-sectional view depicting a state in which the protective member is provided on the front surface of the wafer of FIG. 5A, in a partly enlarged manner.

Diameter of the cutting blade: ϕ50 mm
Rotational speed of the cutting blade: 30,000 rpm
Amount of supplying cutting water: 2 litters/minute
Feed speed: 50 mm/s The grooves 18 or 30 as a start point of division are formed on the front surface 2a side of the wafer 2. Hence, in a case in which the grooves 18 or 30 are formed as a start point of division, as depicted in FIG. 5A and FIG. 5B, after the division start point forming step is carried out, the protective member providing step is carried out.

(Back Surface Grinding Step)

After the protective member providing step and the division start point forming step are carried out, the protective member 8 side is held on the chuck table with the back surface 2b of the wafer facing upward, and the back surface 2b of the wafer 2 is ground to a desired thickness, and a plurality of division grooves 48 are formed in all the division lines 4 to thereby divide the wafer 2 into individual device chips. Thus, the back surface grinding step is carried out.

Figure 6A:
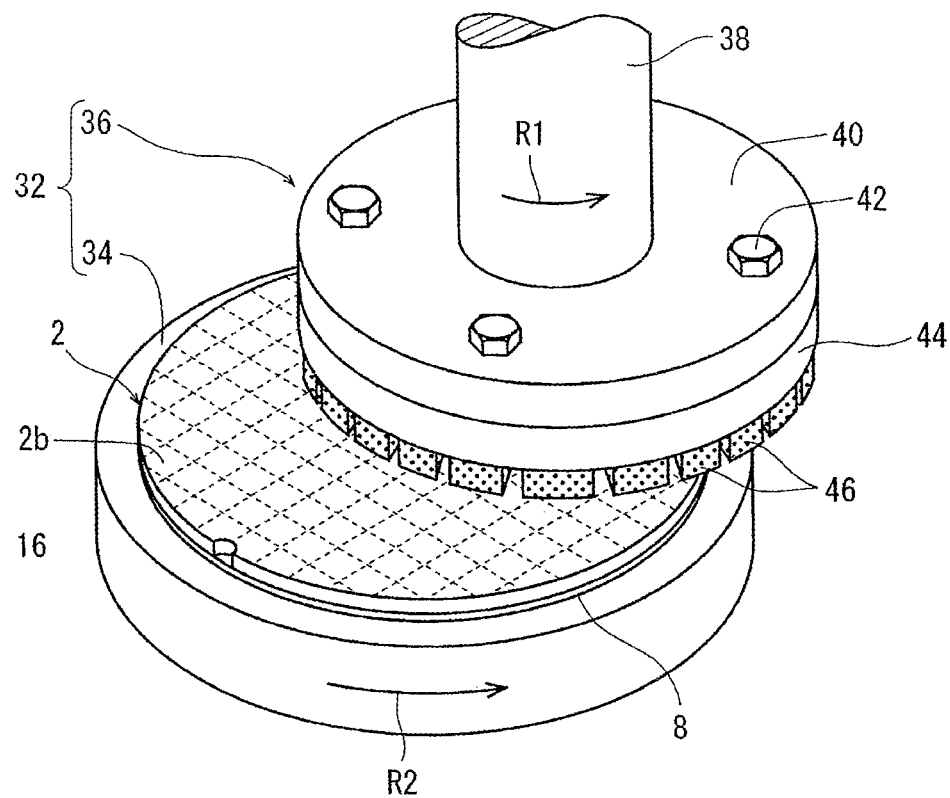
FIG. 6A is a perspective view depicting a back surface grinding step in the wafer processing method.

The back surface grinding step can be carried out, for example, with use of a grinding apparatus 32 depicted in FIG. 6A. The grinding apparatus 32 includes a chuck table 34 for holding under suction the wafer 2, and a grinding unit 36 which grinds the wafer 2 held under suction on the chuck table 34.

The grinding unit 36 includes a spindle 38 extending in a vertical direction, and a disc-shaped wheel mount 40 which is fixed to a lower end of the spindle 38. The wheel mount 40 has an annular grinding wheel 44 fastened through a bolt 42 on a lower surface of the wheel mount 40. The grinding wheel 44 has a plurality of grinding stones 46 fixed on an outer peripheral edge portion of a lower surface thereof, the grinding stones 46 being disposed in an annular shape at a distance from each other in a circumferential direction.

In the back surface grinding step, first, with the back surface 2b of the wafer 2 facing upward, the wafer 2 is held under suction on an upper surface of the chuck table 34. Then, the spindle 38 is rotated in a direction indicated with an arrow R1 in FIG. 6A at a predetermined rotational speed (for example, 6,000 rpm). In addition, the chuck table 34 is rotated in a direction indicated with an arrow R2 at a predetermined rotational speed (for example, 300 rpm).

Then, the spindle 38 is lowered to bring the grinding stones 46 into contact with the back surface 2b of the wafer 2, and grinding water is supplied to a portion at which the grinding stones 46 are brought into contact with the back surface 2b of the wafer 2. Thereafter, by lowering the spindle 38 at a predetermined grinding feed speed (for example, 1.0 μm/s), the back surface 2b of the wafer 2 is ground to thin the wafer 2 to the finished thickness of the device chip.

Figure 6B:
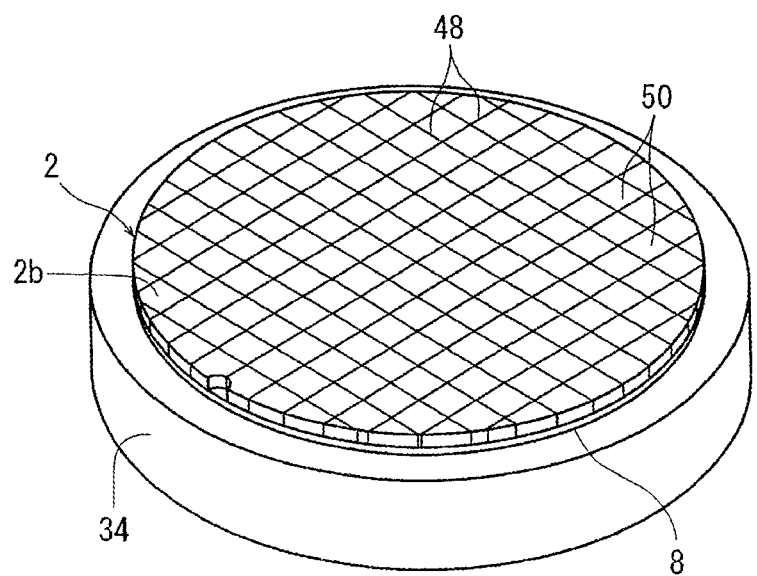
FIG. 6B is a perspective view of the wafer formed with division grooves.

In a case in which the modified layers 16 are formed as a start point of division, due to a pressing force acting on the wafer 2 in grinding the wafer 2, a crack extends from the modified layer 16 in a thickness direction of the wafer 2, and as depicted in FIG. 6B, the wafer 2 is divided into individual device chips 50. In addition, each crack extending from the modified layer 16 causes formation of the division grooves 48 (each groove reaching from the front surface 2a to the back surface 2b), so that a side surface of the device chip 50 becomes a cleaved surface.

In contrast, in a case in which the laser-processed grooves 18 or the cut grooves 30 are formed as a start point of division, since a depth of the groove 18 or 30 is the depth corresponding to the finished thickness of the device chip 50, the back surface 2b of the wafer 2 is ground to reach the above thickness, and as a result, the grooves 18 or 30 are exposed to the back surface 2b of the wafer 2 to thereby form the division grooves 48. Hence, the wafer 2 is divided into individual device chips 50.

(Sheet Providing Step)

After the back surface grinding step is carried out, a sheet providing step is carried out in which an expandable sheet is provided onto the back surface 2b of the wafer 2 and the protective member 8 is removed from the front surface 2a of the wafer 2.

Figure 7A:
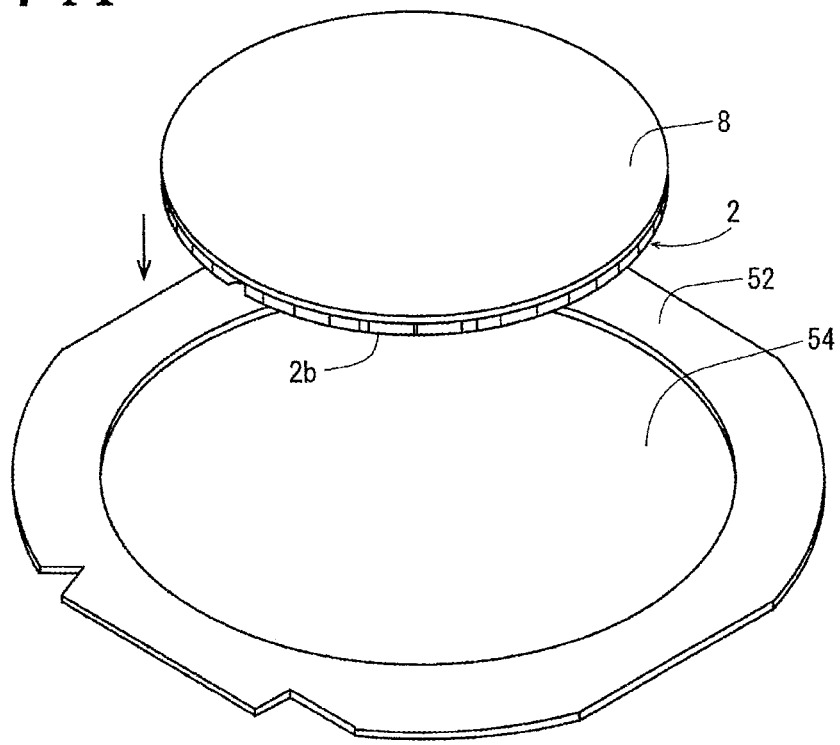
FIG. 7A is a perspective view depicting a state in which an expandable sheet is provided on a back surface of the wafer in a sheet providing step in the wafer processing method.
Figure 7B:
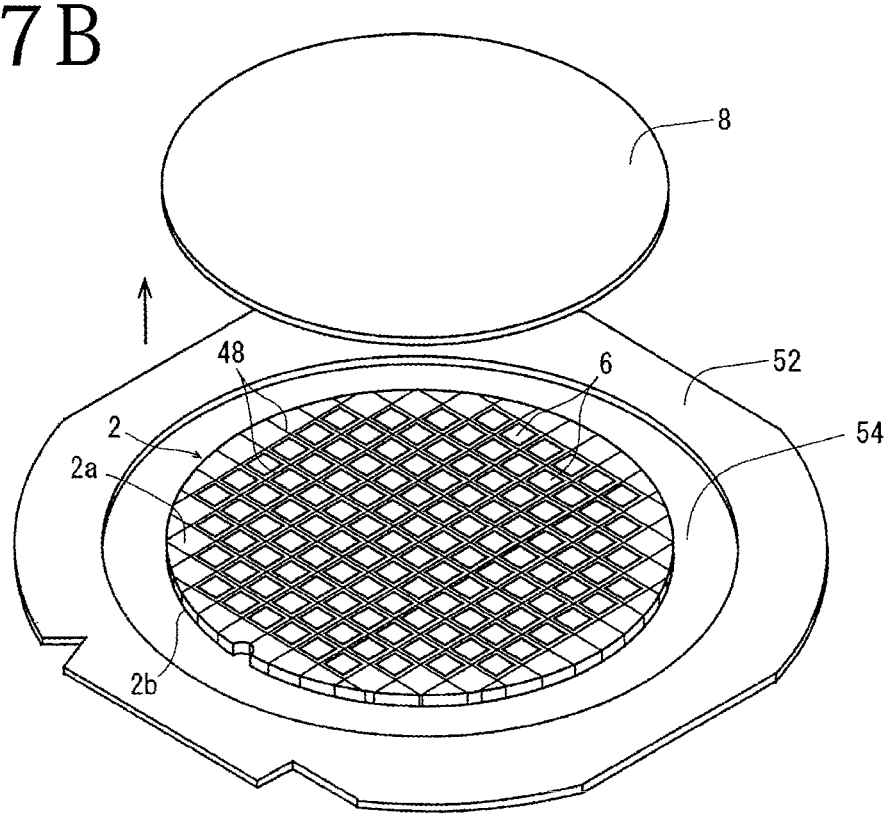
FIG. 7B is a perspective view depicting a state in which the protective member is removed from the front surface of the wafer in the sheet providing step.

In the sheet providing step, as depicted in FIG. 7A, the wafer 2 is provided onto a circular sheet 54 having a peripheral edge thereof fixed to a lower surface of an annular frame 52. As the sheet 54, an expandable adhesive tape (for example, an adhesive tape made of vinyl chloride) can be used. In this case, the back surface 2b of the wafer 2 is only required to be attached to an adhesive surface of the sheet 54. In addition, after the back surface 2b of the wafer 2 is attached to the sheet 54, as depicted in FIG. 7B, the protective member 8 is then removed from the front surface 2a of the wafer 2.

(Adhesive Liquid Coating Step)

After the sheet providing step is carried out, an adhesive liquid coating step is carried out in which an adhesive liquid having flowability is supplied onto the front surface 2a of the wafer 2 to coat the front surface 2a in whole.

Figure 8A:
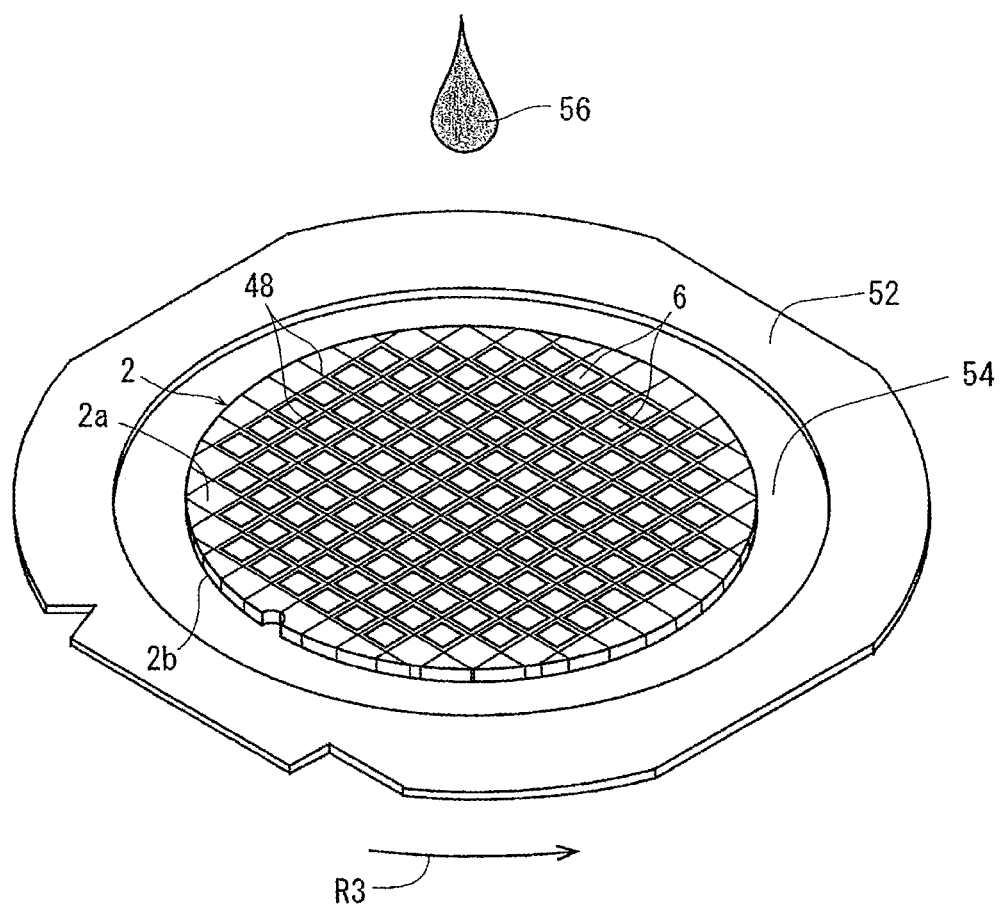
FIG. 8A is a perspective view depicting an adhesive liquid coating step in the wafer processing method.

A description is given with reference to FIG. 8A. In the adhesive liquid coating step, with the front surface 2a of the wafer 2 facing upward, the adhesive liquid 56 having flowability is dropped onto a central portion of the front surface 2a of the wafer 2. In a cleaning step to be described later, in order to easily remove the adhesive liquid 56 from the wafer 2, a water-soluble resin may preferably be used as the adhesive liquid 56. Examples of the water-soluble resin which is usable as the adhesive liquid 56 include polyvinyl alcohol, polyethylene oxide, polyacrylamide, carboxymethyl cellulose, resol-type phenolic resin, methylolated urea-formaldehyde resin, or methylolated melamine resin.

Figure 8B:
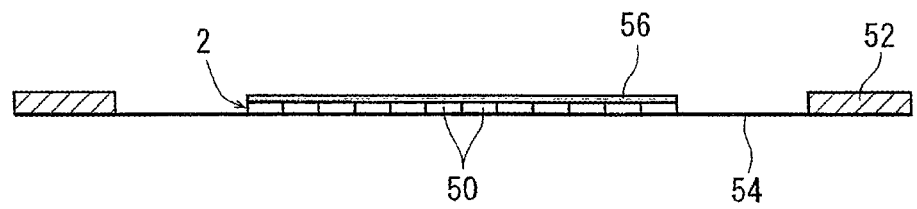
FIG. 8B is a cross-sectional view of the wafer coated with an adhesive liquid.

After the adhesive liquid 56 is dropped onto the central portion of the front surface 2a of the wafer 2, the wafer 2 is rotated in a direction indicated with an arrow R3, causing the adhesive liquid 56 to flow due to a centrifugal force. Accordingly, as depicted in FIG. 8B, the adhesive liquid 56 can be applied to the front surface 2a of the wafer 2 at a substantially uniform thickness.

(Sheet Expanding Step)

After the adhesive liquid coating step is carried out, a sheet expanding step is carried out in which the sheet 54 provided in the sheet providing step is expanded and shrunk such that a width of each of the division grooves 48 is expanded to allow the adhesive liquid 56 to enter each of the division grooves 48 and the width of each of the division grooves 48 is decreased to discharge the adhesive liquid 56 from each of the division grooves 48.

Figure 9:
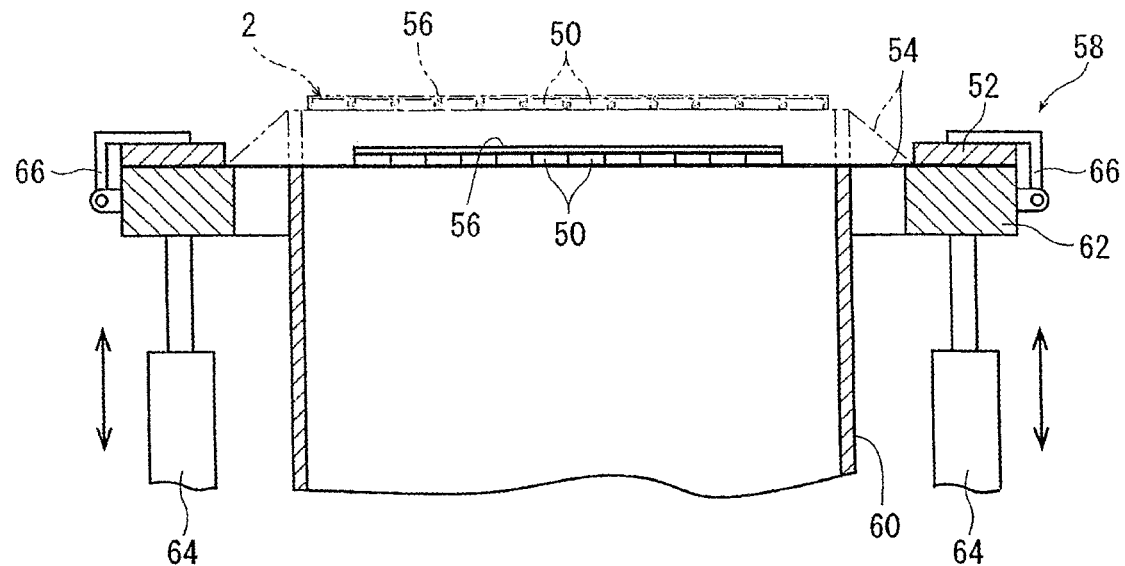
FIG. 9 is a cross-sectional view depicting a sheet expanding step in the wafer processing method.

The sheet expanding step can be carried out with use of an expanding apparatus 58 depicted in FIG. 9, for example. The expanding apparatus 58 includes a cylindrical drum 60, an annular holding member 62 which is provided at an outer periphery of the drum 60, and a plurality of air cylinders 64 which move the holding member 62 in a vertical direction. The holding member 62 has a plurality of clamps 66 provided at an outer peripheral edge thereof at an interval in a circumferential direction.

In the sheet expanding step, first, with the wafer 2 formed with the division grooves 48 facing upward, the frame 52 is placed on an upper surface of the holding member 62. Then, the plurality of clamps 66 fix the frame 52. Then, the plurality of air cylinders 64 move the holding member 62 downward, causing a radial tensional force to act on the sheet 54. As a result, as depicted with a two-dot chain line in FIG. 9, the width of each of the division grooves 48 is expanded, and accordingly, the adhesive liquid 56 enters each of the division grooves 48.

Subsequently, the plurality of air cylinders 64 move the holding member 62 upward, and the radial tensional force acting on the sheet 54 is canceled, thereby reducing the width of each of the division grooves 48 to discharge the adhesive liquid 56 from each of the division grooves 48. In this manner, expansion and shrinkage of the width of each of the division grooves 48 are carried out plural times, repeating enter of the adhesive liquid 56 to each of the division grooves 48 and discharge of the adhesive liquid 56 from each of the division grooves 48. As a result, the processing debris attached to the side surface of the device chip 50 can be caught by the adhesive liquid 56.

(Cleaning Step)

After the sheet expanding step is carried out, a cleaning step is carried out in which the adhesive liquid 56 is removed from the front surface 2a of the wafer 2, and at least the side surface of each of the division grooves 48 is cleaned.

Figure 10:
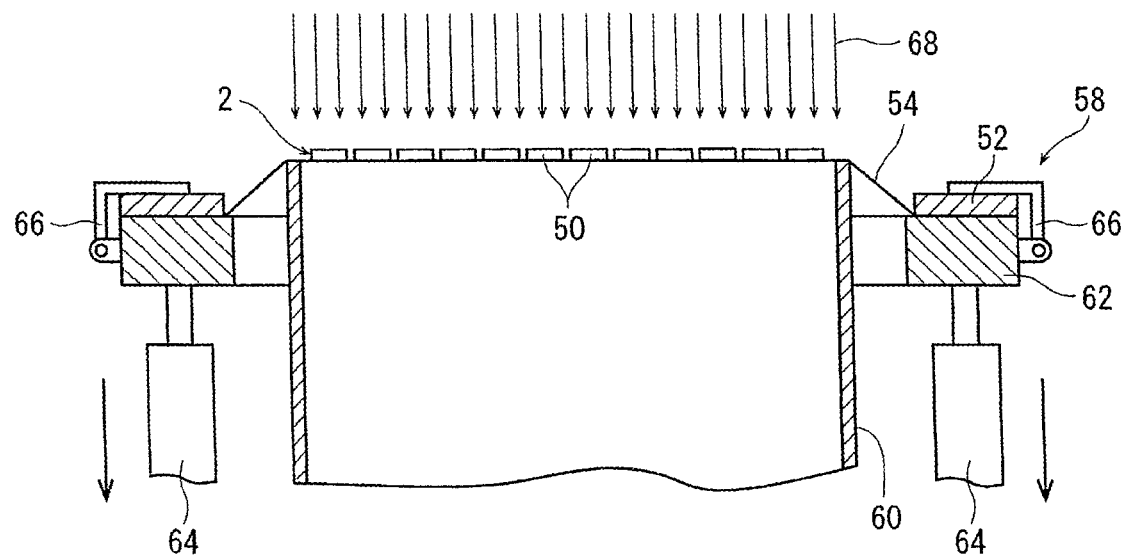
FIG. 10 is a cross-sectional view depicting a cleaning step in the wafer processing method.

In the cleaning step, as depicted in FIG. 10, in a state in which the width of each of the division grooves 48 is expanded by the expanding apparatus 58, cleaning water 68 is supplied toward the wafer 2 (the device chips 50) from above. Accordingly, it is possible to remove the processing debris from the front surface and the side surface of each of the device chips 50, along with the adhesive liquid 56.

As described above, in the wafer processing method according to the embodiment of the present invention, the adhesive liquid 56 having flowability catches the processing debris attached to the side surface of each of the device chips 50, and the side surface of each of the division grooves 48 is cleaned, so that the processing debris can be removed from the side surface of each of the device chips 50 along with the adhesive liquid 56.

Hence, in such processes as wire bonding, die bonding, and stacking of device chips 50 which are to be carried out in the back-end process, it is possible to eliminate a problem that the processing debris scattered and falling from the side surface of each of the device chips 50 prevents the bonding and is attached to the front surface of each of the device chip 50 to thereby cause the stacked device chips 50 to be damaged.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of dividing a wafer into individual device chips, the wafer having a plurality of devices formed on a front surface thereof, and the front surface being demarcated by a plurality of crossing division lines, the method comprising:
   a division start point forming step of forming a start point of division along each of the division lines;
   a protective member providing step of providing, on the front surface of the wafer, a protective member for protecting the front surface of the wafer, before or after the division start point forming step is carried out;
   a back surface grinding step of holding the protective member side of the wafer on a chuck table, grinding a back surface of the wafer to finish the wafer to a desired thickness, and forming division grooves along the division lines to divide the wafer into individual device chips;
   a sheet providing step of providing an expandable sheet to the back surface of the wafer and removing the protective member from the front surface of the wafer;
   an adhesive liquid coating step of coating the front surface of the wafer with an adhesive liquid having flowability;
   a sheet expanding and shrinking step of expanding and shrinking the sheet provided in the sheet providing step such that a width of each of the division grooves is expanded to allow the adhesive liquid to enter each of the division grooves and the width of each of the division grooves is decreased to discharge the adhesive liquid from each of the division grooves; and
   a cleaning step of removing the adhesive liquid from the front surface of the wafer to clean at least a side surface of each of the division grooves.

2. The wafer processing method according to claim 1, wherein
   in the division start point forming step, a focusing point of a laser beam of a wavelength transmitting through the wafer is positioned inside the wafer corresponding to each of the division lines, and laser beam is applied to the wafer, thereby forming a modified layer serving as a start point of division.

3. The wafer processing method according to claim 1, wherein
   in the division start point forming step, grooves each having a depth corresponding to a finished thickness of each of the device chips are formed along the division lines so as to function as a start point of division.

4. The wafer processing method according to claim 3, wherein
   the protective member providing step is carried out after the division start point forming step is carried out.

5. The wafer processing method according to claim 1, wherein
   the adhesive liquid used in the adhesive liquid coating step is selected from the group consisting of polyvinyl alcohol, polyethylene oxide, polyacrylamide, carboxymethyl cellulose, resol-type phenolic resin, methylolated urea-formaldehyde resin, and methylolated melamine resin, and
   in the cleaning step, cleaning water is supplied to remove the adhesive liquid.

* * * * *